(12) United States Patent
Shepard

(10) Patent No.: US 8,108,735 B2
(45) Date of Patent: *Jan. 31, 2012

(54) ERROR CORRECTING MEMORY ACCESS MEANS AND METHOD

(75) Inventor: Daniel Robert Shepard, North Hampton, NH (US)

(73) Assignee: Contour Semiconductor, Inc., North Billerica, MA (US)

( * ) Notice: Subject to any disclaimer, the term of this patent is extended or adjusted under 35 U.S.C. 154(b) by 1319 days.

This patent is subject to a terminal disclaimer.

(21) Appl. No.: 11/541,354

(22) Filed: Sep. 29, 2006

(65) Prior Publication Data

US 2007/0028150 A1    Feb. 1, 2007

Related U.S. Application Data

(63) Continuation of application No. 10/411,594, filed on Apr. 10, 2003, now Pat. No. 7,149,934.

(60) Provisional application No. 60/371,876, filed on Apr. 11, 2002.

(51) Int. Cl.
*G06F 11/00* (2006.01)

(52) U.S. Cl. .......................................... 714/48; 714/718

(58) Field of Classification Search .................... 714/48, 714/49, 52, 766, 720, 718, 763, 764, 765
See application file for complete search history.

(56) References Cited

U.S. PATENT DOCUMENTS

| 6,457,156 | B1 * | 9/2002 | Stenfort | 714/785 |
| 2002/0099996 | A1 * | 7/2002 | Demura et al. | 714/769 |
| 2004/0153944 | A1 * | 8/2004 | Shepard | 714/758 |

* cited by examiner

*Primary Examiner* — Dieu-Minh Le
(74) *Attorney, Agent, or Firm* — Bingham McCutchen LLP

(57) ABSTRACT

Solid-state memory devices featuring pluralities of lines of data storage elements are configured for read and/or write access by alternately or simultaneously accessing different lines.

12 Claims, 3 Drawing Sheets

ERROR CORRECTING MEMORY ACCESS MEANS AND METHOD

CROSS-REFERENCE TO RELATED APPLICATIONS

This application claims the benefit of and priority to U.S. application Ser. No. 10/411,594, filed Apr. 10, 2003, which claims the benefit of U.S. Provisional Application Ser. No. 60/371,876, filed Apr. 11, 2002; the entire disclosures of both applications are hereby incorporated by reference.

FIELD OF THE INVENTION

The present invention relates to memory devices which utilize error correcting, and more particularly to semiconductor memory devices in which the addressing pattern is optimized to better facilitate error correcting techniques and reduce device testing.

BACKGROUND OF THE INVENTION

As advances continue to be made in the area of semiconductor memory devices, high capacity and low cost will be increasingly important. In particular, it will be necessary to create memory devices for which the testing of the device must be minimized in order to minimize costs. Current memory testing costs are significant and are expected to grow as the capacity of the devices grows. The cost of the testing can be estimated by dividing the annual amortized plus variable costs of the test equipment by the number of devices tested per year. The higher the memory's capacity, the more storage locations that must be tested, and the longer the testing operation will take. As memory devices enter the Gigabyte range and larger, the number of devices that a given piece of test equipment can test in a given period of time will go down. As a result, the cost per unit attributable to testing should rise. If testing is to be reduced or eliminated while maintaining high manufacturing yields, a new approach to error correcting will have to be employed.

The prior art includes many approaches for correcting errors in memory devices. This is typically accomplished by identifying faults and substituting for them. One approach to error correcting is to thoroughly test the memory device at the time of manufacture, to identify the points of failure within the device and to remap, rewire or reconfigure the device to substitute extra circuitry included in the device for the defective circuits. This can done at the time of manufacture by laser burning the wiring so as to make the circuit substitution. However, this requires that each device be thoroughly tested in order to identify the locations of the faults and this extensive testing can be very expensive, especially when the number of bytes of memory is very large. The subsequent post-manufacturing error correcting of this approach further increases the cost of the device.

Alternatively, logic can be incorporated into the device that can maintain a table of defective bit locations and dynamically substitute functioning storage bits for the bits determined to be defective, and this determination can be made during device operation. But, this requires that the spare bits, at least, be tested for proper operation and each memory must undergo self analysis before it can be used or during ongoing operation of the device. Average device density is also reduced as chip area is consumed by the fault detection and correction circuitry.

Rotating storage media, such as some magnetic disks, CD-ROM and DVD deals with this problem by including enough error correcting bits to fix a predetermined number of flawed bits. With this class of storage device, the individual data bits need not be tested for correctness because the likely worst-case number of bad bits has been calculated in advance and an error correcting algorithm (along with its necessary number of error correcting bits) is selected to ensure that this worst-case number of bad bits can be corrected. In this way, the cost of testing vast quantities of data bits can be avoided along with the associated testing costs. This approach is especially useful for storage devices that operate on data in large blocks or sectors where error correcting techniques are most efficient. Typically, as the size of a block of data increases, the number of error correcting bits increases more slowly; this results in a smaller percentage of error correcting bits as the size of the data block grows. This method of error correcting in a block of data works as long as the number of data bits does not exceed the worst-case number of bad bits.

Semiconductor memories are typically laid out as a two dimensional array having a plurality of row lines and column lines. While it is possible that any given bit in the array is flawed and inoperative, one must also worry about other failure modes. One common failure mode occurs when one of these rows or columns has a break in it thereby making a portion of the array addressed by that row or column inaccessable. Alternatively, another common failure mode occurs when a short circuit exists between adjacent rows, adjacent columns, or a row and a column thereby making it impossible to separately address bits accessed by the shorted together rows or columns. In both of these failure modes, large numbers of data bits can be inaccessible (i.e., all the bits that would be accessed by the flawed row or column). Therefore, as with the application of error correcting for CD-ROM and DVD, too many bits may be lost in a given block of bits for the error correcting algorithm and error correcting bits to be able to correct for these errors.

Presently, in some applications such as digital photography and music and video playback, to name a few, memory is so expensive that its cost often greatly exceeds the value of the data contained within it. Since data in these examples is accessed in as large blocks, CD-ROM and DVD have become popular because this media is inexpensive. However, CD-ROM and DVD are inconvenient because they are fragile and consume large amounts of power due to their lasers, motors and servo mechanisms.

What is needed is an inexpensive memory device, particularly for these large data applications that happen to access data in large blocks, for which error correcting can be implemented without having to extensively test the device at the time of manufacture and which can be effective for the expected worst case number of bad bits even if row or column line breaks or shorts exist.

SUMMARY OF THE INVENTION

The present invention is a means and a method for addressing streams of data stored within a memory device so as to minimize the cost of device testing and thereby the cost of the device itself. Solid-state memory is typically thought of as working in random access mode. As such, most solid-state memory is designed for error-free operation. However, many emerging applications require data that is accessed in long blocks. For such applications, these blocks can efficiently utilize error correcting. The present invention is a means and a method for accessing the locations in a memory device so as to avoid having error correcting techniques fail due to such common memory device faults as shorts or breaks among the row lines and column lines or as defective data bit storage elements. By enabling error correcting memory to function even when such common flaws exist, testing costs can be significantly reduced while maintaining high device yields. Finally, this addressing approach is applied in the same way regardless of whether the data is being written into or read out of the device.

By reducing the cost of solid state memory through the reduction of the testing costs, the present invention can also be used to reduce the cost of systems which use large amounts of data. As is the case with CD-ROM and DVD systems, this error corrected, solid-state data storage in these systems can be fixed or removable and interchangable or a combination of the two. These systems can range from computers to personal digital assistants (PDA's) to digital cameras.

DETAILED DESCRIPTION OF THE PREFERRED EMBODIMENTS

The present invention is a means for accessing memory in a way that better facilitates error correcting within the memory device. In non-electronic storage devices such as CD-ROM and DVD, data is accessed in sectors or blocks. That is to say that the data is accessed not bit by bit or byte by byte, but rather as a block of data from which individual bits or bytes can then be read (when writing, the data bits or bytes are written to the data block which is then enhanced with error-correcting bits and the block is copied to the memory device). Included within this block of data are error-correcting bits which through an algorithm (e.g., hamming codes and other error correcting techniques as are well known to those skilled in the art) can detect the presence of erroneous data bits and can correct those error bits (up to a maximum number of correctable error bits per block as determined by the number of error correcting bits and the error correcting algorithm employed). By doing this, the individual data storage elements do not need to be tested because, statistically, there should always be few enough data bits to ensure that the error correcting method will yield a correct result. The tradeoff in these error-correcting algorithms is that the more erroneous bits one would like to be able to correct in a given block, the more error correcting bits (and, correspondingly, the more additional memory bits) that will be required.

This technique can be transferred to solid-state memory. By doing so, the individual data bits will likewise not need to be tested. However, solid-state memory does suffer from certain failure modes that, if not handled carefully, will require more device testing than might otherwise be necessary. In particular, solid-state memory is typically laid out in two-dimensional arrays (and, more recently, three-dimensional arrays). As a result, long row lines and column lines interconnecting the bit locations could fail and, as a result, cause the misreading of long sequences of data bits (i.e., all the data bits accessed by a given faulted row or column line). Typical failures include breaks in a line causing an interruption in the current path and shorts in a line causing an undesired connection to an adjacent line or circuit.

Figure 1:
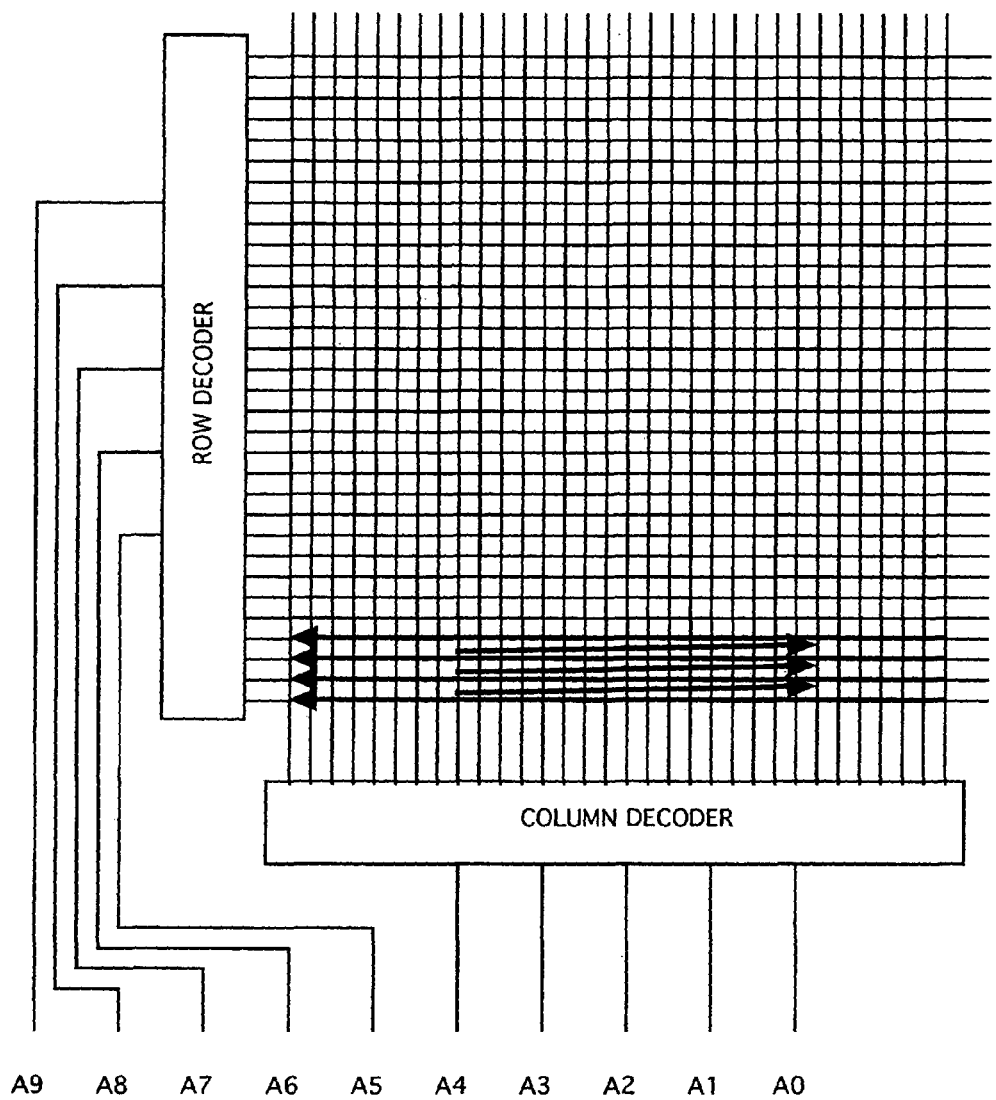
FIG. 1. illustrates a conventional memory layout and access sequence.

Memory devices accept address lines as inputs and then decode these addresses to select a single row and a single column to access the data bit at the point of intersection between the selected row and the selected column. FIG. 1 illustrates such a decoder layout and the start of a path followed through the data bits during sequential data access. The decode may group the lower address bits together to select one column via a column decoder and will group the remaining upper address bits to access the rows via a row decoder. As a result, typical operation when sequentially accessing the device is for one row to be selected (according to the upper address bits) and this selection persists while the lower address bits are stepped through sequentially resulting in stepping through each column. This presents a problem in that if any one row connected to the upper address decoder suffers a failure, all data bits accessed while that failed row is enabled will be bad. When this occurs, the number of bad data bits will typically exceed the maximum number of bits that can be corrected. Of course, one could add more error correcting bits, but the more additional memory bits that are needed to hold those error correcting bits, the more costly the memory device will become for a given overall data set, and the number of error correcting bits that might be required to correct for an entire line of bad bits may make such a solution impractical.

Figure 2:
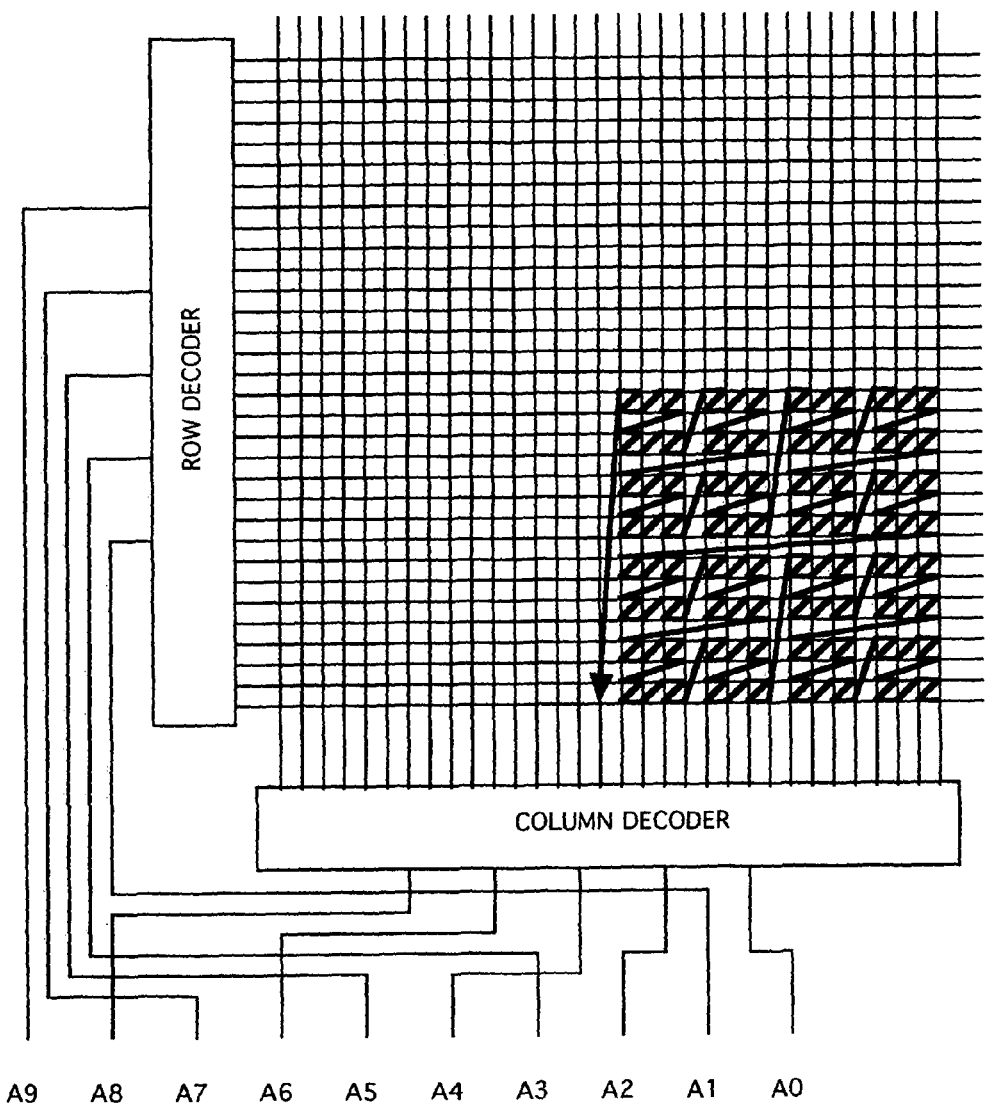
FIG. 2. illustrates a memory device laid out with error correcting optimization.
Figure 3:
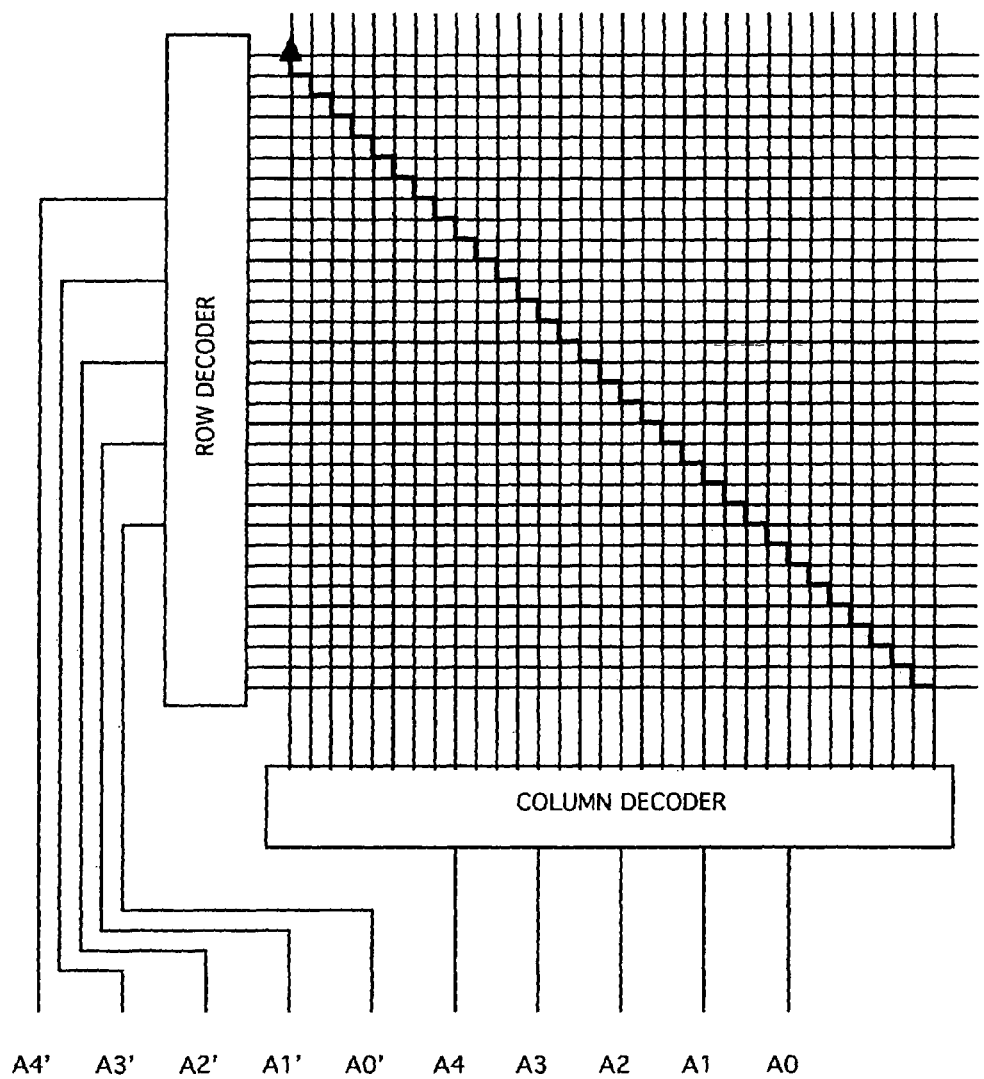
FIG. 3. illustrates a memory device laid out with error correcting optimization with more efficient sequencing through alternating address sequencing.

Refer now to FIG. 2, which shows a preferred embodiment of the invention. As can be seen, the address lines alternate between the row decoder circuitry and the column decoder circuitry. As a result, a sequential access of the memory device will access data bits in a pseudo-random path across the two-dimensional array. This implementation is in effect taking a conventional memory device as shown in FIG. 1 and relabeling the address wires to enable the diagonal, sequential access. FIG. 3, therefore, shows the present invention where the address lines are are labeled in a conventional way but the address sequencing is performed by the address generating logic. This address generating logic will work by looking at the upper and lower address decoders separately and alternately incrementing the lower address and then the upper address. When the lower and upper sub-addresses start out with the same zero values, the diagonal access path that goes from the bottom right corner to the top left corner as shown will be followed. If the upper sub-address starts out with a binary value of 00001, the path will be displaced upwards by one row as it diagonally goes through the array and, when the diagonal scan path reaches the top edge of the array, wrapping vertically and continuing upward from the bottom edge of the array. In this way, only two bits will be accessed from each row and column thereby greatly reducing the impact of a failed row or column line. The key to the present invention is that the sequential data stream stored in the device is stored such that sequential access of that data will not dwell on a single (or a small number of) row or column line. Ideally, even the testing of individual rows and columns may be eliminated and with it the associated costs.

Several variations will come to mind in light of the present teaching. Any access order that limits the number of bits read via a given row or column during the access of a single data block (including that block's error correcting bits) to be less than or equal to the number of bits that can be corrected will meet the requirements of the present invention. This could include having the address alternating between the row and column address decoders after incrementing one sub-address or the other multiple times, as opposed to alternating between upper (row) and lower (column) address decoders after incrementing either one. Alternatively, both sub-addresses could be incremented every time resulting in a truly diagonal path across the array with only one bit selected on each row and one bit selected on each column per diagonal scan. More sophisticated pseudo-random bit pattern generators could be utilized to achieve an improved effect to that shown in FIG. 2 as long as they do not dwell on a given row or column line.

Another variation will come to mind if the memory is laid out three-dimensionally either by dividing up what might otherwise be a single two-dimensional array into multiple two-dimensional arrays on the same plane or by stacking multiple two-dimensional arrays in a third dimension—vertically—or by the combination of the two approaches (four or larger dimensional arrays). In this event, the access would be balanced out, not only in two dimensions, but in the third or greater dimensions as well. In this way, if one of the two-dimensional arrays within the overall three-dimensional structure was defective, the error correcting could correct for that bad sub-array. Of course, within any multidimensional array, one could achieve the benefit of the present invention in part by moving across any subset of the dimensions. For example, by implementing the diagonal access as shown in FIG. 2 for each layer in a three-dimensional array but not across layers, one would at least be protected from a row or column line failure within each layer, but not from a failure of a complete layer in the third dimension. It would be possible, in a multi-dimensional storage array, to implement the present invention along some, but not all, of the dimensions of the array if some dimensions are more likely to suffer failures than others (e.g., if row lines are more likely to suffer breaks or shorts than column lines).

The foregoing description of an example of the preferred embodiment of the invention and the variations thereon have been presented for the purposes of illustration and description. It is not intended to be exhaustive or to limit the invention to the precise forms disclosed. Many modifications and variations are possible in light of the above teaching. It is intended that the scope of the invention be limited not by this detailed description, but rather by any claims appended hereto.

I claim:

1. A solid-state memory device comprising:
   a first plurality of lines of data storage elements; and
   a second plurality of lines of data storage elements intersecting the first plurality of lines,
   wherein the first plurality of lines and the second plurality of lines form a two-dimensional array configured for at least one of read or write access by alternating between accessing different lines in the first plurality of lines and accessing different lines in the second plurality of lines.

2. The solid-state memory device of claim 1, wherein a number of data storage elements accessed along each accessed line is less than a total number of data storage elements in the line.

3. The solid-state memory device of claim 1, wherein alternating comprises pseudo-randomly alternating.

4. The solid-state memory device of claim 1, further comprising:
   a third plurality of lines of data storage elements intersecting the first and second pluralities of lines,
   wherein the third plurality of lines, the first plurality of lines, and the second plurality of lines form a three-dimensional array configured for at least one of read or write access by alternating among different lines in the three pluralities of lines.

5. The solid-state memory device of claim 1, wherein a portion of the array is removable.

6. A solid-state memory device comprising:
   a plurality of lines of data storage elements,
   wherein the solid-state memory device is configured for at least one of read or write access by alternating between accessing different lines within the plurality of lines.

7. The solid-state memory device of claim 6, wherein a number of data storage elements accessed along each accessed line is less than a total number of data storage elements in the line.

8. The solid-state memory device of claim 6, wherein alternating comprises pseudo-randomly alternating.

9. The solid-state memory device of claim 6, wherein a portion of the solid-state memory device is removable.

10. A solid-state memory device comprising:
    a first plurality of lines of data storage elements; and
    a second plurality of lines of data storage elements intersecting the first plurality of lines,
    wherein the first plurality of lines and the second plurality of lines form a two-dimensional array configured for at least one of read or write access by simultaneously accessing different lines in the first plurality of lines and the second plurality of lines.

11. The solid-state memory device of claim 10, wherein the array is configured for at least one of read or write access by alternating between accessing different lines in the first plurality of lines and accessing different lines in the second plurality of lines.

12. The solid-state memory device of claim 10, wherein a portion of the array is removable.

* * * * *